US011755235B2

(12) United States Patent
Neudorf

(10) Patent No.: US 11,755,235 B2
(45) Date of Patent: Sep. 12, 2023

(54) INCREASING RANDOM ACCESS BANDWIDTH OF A DDR MEMORY IN A COUNTER APPLICATION

(71) Applicant: Ciena Corporation, Hanover, MD (US)

(72) Inventor: Kenneth Edward Neudorf, Ottawa (CA)

(73) Assignee: Ciena Corporation, Hanover, MD (US)

( * ) Notice: Subject to any disclaimer, the term of this patent is extended or adjusted under 35 U.S.C. 154(b) by 87 days.

(21) Appl. No.: 17/097,267

(22) Filed: Nov. 13, 2020

(65) Prior Publication Data

US 2022/0155991 A1 May 19, 2022

(51) Int. Cl.
*G06F 3/06* (2006.01)
*G06F 9/50* (2006.01)

(52) U.S. Cl.
CPC .......... *G06F 3/0655* (2013.01); *G06F 3/0613* (2013.01); *G06F 3/0673* (2013.01); *G06F 9/5016* (2013.01)

(58) Field of Classification Search
CPC .... G06F 3/0655; G06F 3/0613; G06F 3/0673; G06F 9/5016
See application file for complete search history.

(56) References Cited

U.S. PATENT DOCUMENTS

| 7,317,725 | B2 | 1/2008 | Etemadi et al. | |
|---|---|---|---|---|
| 8,886,878 | B1 * | 11/2014 | Neudorf | H04L 43/0894 711/100 |
| 9,460,791 | B1 * | 10/2016 | Shallal | G11C 7/1066 |
| 10,885,966 | B1 * | 1/2021 | Devaux | G11C 11/40611 |
| 2017/0371559 | A1 * | 12/2017 | Higgins | G06F 3/0673 |
| 2019/0050284 | A1 * | 2/2019 | Brown | G06F 11/1044 |
| 2019/0066808 | A1 * | 2/2019 | Nale | G11C 11/4087 |
| 2019/0138437 | A1 * | 5/2019 | Bennett | G06F 3/0647 |
| 2020/0020384 | A1 * | 1/2020 | Zhao | G11C 11/40618 |
| 2021/0057005 | A1 * | 2/2021 | Karashima | G11C 7/1069 |

* cited by examiner

*Primary Examiner* — Zhuo H Li
(74) *Attorney, Agent, or Firm* — Baratta Law PLLC; Lawrence A. Baratta, Jr.

(57) ABSTRACT

Systems and methods include storing one or more counters in a plurality of locations in Double Data Rate (DDR) Random Access Memory (RAM) such that each counter is stored partially in multiple locations across the DDR RAM; and accessing banks in the DDR RAM sequentially for read operations and write operations associated with the one or more counters. The multiple locations include a location in each bank of the banks in the DDR RAM. A read operation for a counter is performed by reading all of the corresponding multiple locations and combining associated values to return a result for the counter. A write operation for a counter is performed by writing to a location of the multiple locations that is currently in sequence.

15 Claims, 5 Drawing Sheets

INCREASING RANDOM ACCESS BANDWIDTH OF A DDR MEMORY IN A COUNTER APPLICATION

FIELD OF THE DISCLOSURE

The present disclosure generally relates to memory. More particularly, the present disclosure relates to systems and methods for increasing random access bandwidth of a Double Data Rate (DDR) Random Access Memory (RAM), such as in a counter update read/modify/write application.

BACKGROUND OF THE DISCLOSURE

Double Data Rate 4 Synchronous Dynamic Random-Access Memory (DDR4 SDRAM) is a type of synchronous dynamic random-access memory with a high bandwidth ("double data rate") interface. Of note, true random access in DDR has always been difficult, and it is not supported well, with the refresh, activate and precharge, and read/write turnaround time required to read sequentially random rows using up much of the available bandwidth (for example, it is seen that only 7% of DDR4 bandwidth is available to the user in random access applications). The usual solution is to have a fast data cache in the design and then page swap to external DDR RAM as required. This approach requires a cache RAM and a cache controller, and in the worst case, this does not provide any benefit as a cache miss will require the controller to read from external RAM anyway. Accordingly, random access of DRAM is very inefficient, usually resulting in bandwidth usage of only 7% of the device's theoretical bandwidth due to the activation time, precharge time, and the read/write minimum turnaround time for the device.

Also, Row hammer is an unintended and undesirable side effect in DRAM in which memory cells leak their charges by interactions between themselves, possibly leaking or changing the contents of nearby memory rows that were not addressed in the original memory access. Row hammer mitigation built into DDR4 RAM's count the number of accesses to any single row and refresh the two rows physically adjacent to the row in danger of generating a row hammer effect. This solution affects overall performance as two extra refresh cycles use up bandwidth into the device that could be used by the device's end user.

BRIEF SUMMARY OF THE DISCLOSURE

The present disclosure relates to systems and methods for increasing random access bandwidth of a Double Data Rate (DDR) Random Access Memory (RAM), such as in a counter update read/modify/write application. This present disclosure includes a technique to increase the usable bandwidth of DDR memory in a random-access application to 47% worst case and up to 63% best case from the normal 7.3% achievable in regular random accesses to DDR memory. While at the same time, reducing the chances of a row hammer effect to almost 0. Again, a row hammer event is the corruption of adjacent row data in a DDR4 device when a single row address is accessed continuously between refresh cycles. The technique is to have a partial copy of counter data to be updated in each bank (N banks total) within the RAM module. The DDR controller then accesses these banks in sequence whenever an update is made. Only one bank is updated per counter update request, but when the host reads a counter, all N bank counters are read and then combined (SUM) to return the host's desired result. While this approach stores counters across each bank, this is not a drawback because the number of registers in DDR4 modules is much larger than what is usually needed.

That is, the present disclosure uses multiple locations for the same counter in the RAM, i.e., one location in each of the banks/bank groups in the device, and then reading and combining all of the values in each location from each bank when reading the counter value from DDR RAM. Using each bank in sequence, no time is lost during the activate and precharge, and read/write turnaround time of the read or write cycle. The activate/read/write of the next bank can occur during the read/write/precharge of the previous bank. Also, using sequential bank address accesses reduced the effect of row hammer refresh mitigation within the DDR device to improve overall DDR4 performance. Advantageously, this technique enables lower cost as fewer devices may be required for the same application, lower power again due to the fewer devices, more board space, and use of low-cost DDR4 instead of more expensive SRAM.

In an embodiment, a method includes storing one or more counters in a plurality of locations in Double Data Rate (DDR) Random Access Memory (RAM) such that each counter is stored partially in multiple locations across the DDR RAM; and accessing banks in the DDR RAM sequentially for read operations and write operations associated with the one or more counters. The multiple locations include a location in each bank of the banks in the DDR RAM. The method can further include performing a read operation for a counter by reading all of the corresponding multiple locations and combining associated values to return a result for the counter. The method of can further include performing a write operation for a counter by writing to a location of the multiple locations that is currently in sequence. The DDR RAM can include N banks and the multiple locations can include one in each of the N banks. The accessing sequentially reduces a likelihood of a row hammer effect by a factor of N. The DDR RAM can be DDR4 RAM.

In another embodiment, a counter update circuit includes a plurality of First-In-First-Out (FIFO) circuits connected to a Double Data Rate (DDR) controller connected to DDR Random Access Memory (RAM), wherein the DDR controller is configured to cause storage of one or more counters in a plurality of locations in the DDR RAM such that each counter is stored partially in multiple locations across the DDR RAM, and cause access of banks in the DDR RAM sequentially for read operations and write operations associated with the one or more counters. The multiple locations can include a location in each bank of the banks in the DDR RAM. The DDR controller can be further configured to perform a read operation for a counter by causing a read of all of the corresponding multiple locations and a combination of associated values to return a result for the counter. The DDR controller can be further configured to perform a write operation for a counter by causing a write to a location of the multiple locations that is currently in sequence. The DDR RAM can include N banks and wherein the multiple locations include one in each of the N banks. The sequential access reduces a likelihood of a row hammer effect by a factor of N. The DDR RAM can be DDR4 RAM.

In a further embodiment, a Double Data Rate (DDR) Random Access Memory (RAM) includes an interface to a DDR controller; and a plurality of banks for storing data, wherein the plurality of banks include one or more counters each stored in a plurality of locations such that each counter is stored partially in multiple locations across the plurality of banks, and wherein access to the plurality of banks by the DDR controller is performed sequentially for read operations and write operations associated with the one or more counters. The multiple locations can include a location in each bank of the plurality of banks. A read operation for a counter can be performed by reading all of the corresponding multiple locations and combining associated values to return a result for the counter. A write operation for a counter can be performed by writing to a location of the multiple locations that is currently in sequence. The plurality of banks can include N banks, and wherein the sequential access reduces a likelihood of a row hammer effect by a factor of N. The DDR RAM can be DDR4 RAM.

BRIEF DESCRIPTION OF THE DRAWINGS

The present disclosure is illustrated and described herein with reference to the various drawings, in which like reference numbers are used to denote like system components/method steps, as appropriate, and in which:

FIG. 2 is a screenshot of a conventional implementation with random access. FIG. 3 is a screenshot of an implementation using the techniques described herein where every update goes to the same row. FIG. 4 is a screenshot of an implementation using the techniques described herein where every update is random.

DETAILED DESCRIPTION OF THE DISCLOSURE

Again, the present disclosure relates to systems and methods for increasing random access bandwidth of a Double Data Rate (DDR) Random Access Memory (RAM), such as in a counter update read/modify/write application. This present disclosure includes a technique to increase the usable bandwidth of DDR memory in a random-access application to 47% worst case and up to 63% best case from the normal 7.3% achievable in regular random accesses to DDR memory. While at the same time, reducing the chances of a row hammer effect to almost 0. Again, a row hammer event is the corruption of adjacent row data in a DDR4 device when a single row address is accessed continuously between refresh cycles. The technique is to have a partial copy of counter data to be updated in each bank (N banks total) within the RAM module. The DDR controller then accesses these banks in sequence whenever an update is made. Only one bank is updated per counter update request, but when the host reads a counter, all N bank counters are read and then combined (SUM) to return the host's desired result. While this approach stores counters across each bank, this is not a drawback because the number of registers in DDR4 modules is much larger than what is usually needed.

That is, the present disclosure uses multiple locations for the same counter in the RAM, i.e., one location in each of the banks/bank groups in the device, and then reading and combining all of the values in each location from each bank when reading the counter value from DDR RAM. Using each bank in sequence, no time is lost during the activate and precharge, and read/write turnaround time of the read or write cycle. The activate/read/write of the next bank can occur during the read/write/precharge of the previous bank. Also, using sequential bank address accesses reduced the effect of row hammer refresh mitigation within the DDR device to improve overall DDR4 performance. Advantageously, this technique enables lower cost as fewer devices may be required for the same application, lower power again due to the fewer devices, more board space, and use of low-cost DDR4 instead of more expensive SRAM.

Figure 1:
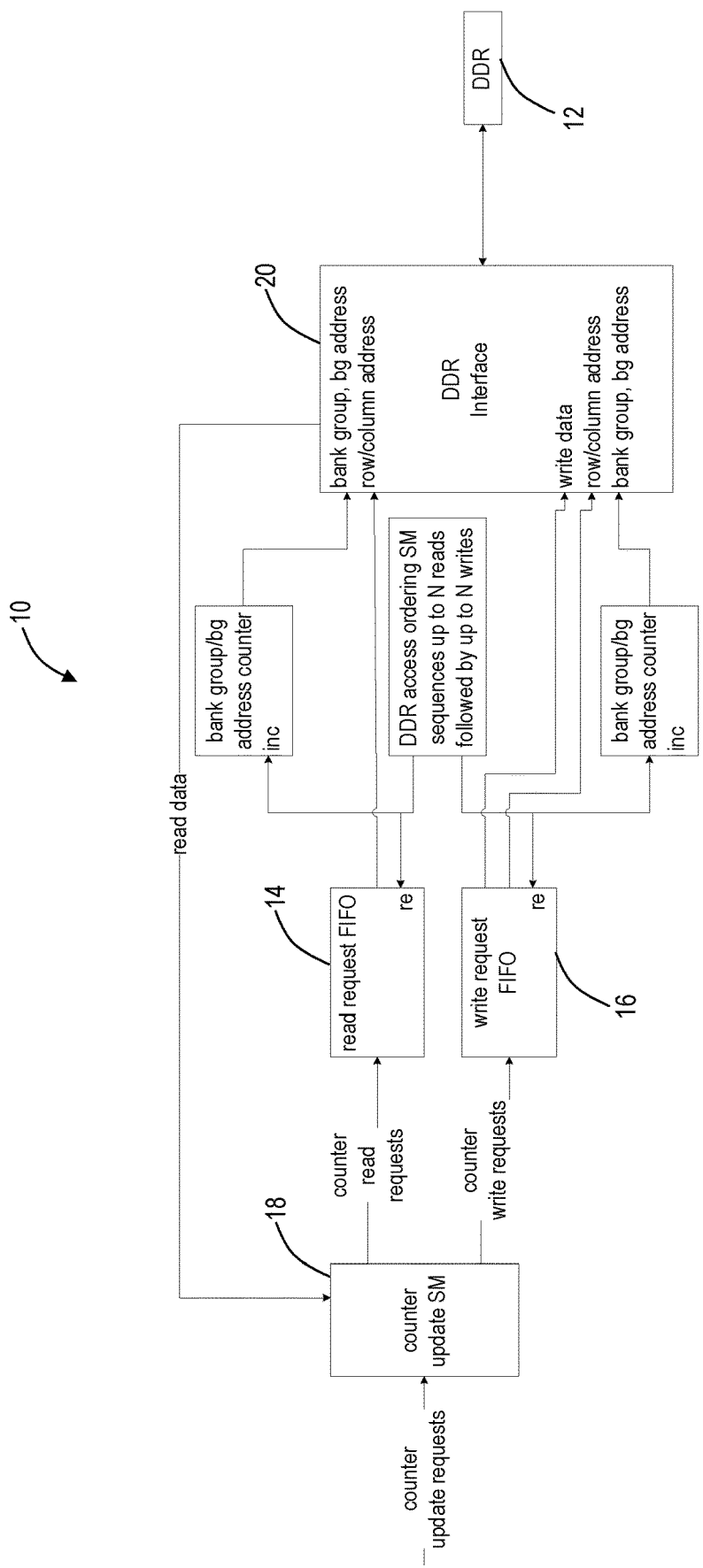
FIG. 1 is a block diagram of a counter update circuit for increasing random access bandwidth of a Double Data Rate (DDR) Random Access Memory (RAM) memory.

FIG. 1 is a block diagram of counter update circuit 10 for increasing random access bandwidth of a Double Data Rate (DDR) Random Access Memory (RAM) memory 12. The counter update circuit 10 can be an Application Specific Integrated Circuit (ASIC), Field Programmable Gate Array (FPGA), or the like, and is connected to DDR memory 12, e.g., DDR4 memory. The counter update circuit 10 includes circuitry for communicating with the DDR memory 12 and may be referred to as a DDR controller, DDR sub-system, etc. The various techniques described herein are implemented in the counter update circuit 10 with the DDR memory 12 configured to store counter values in multiple locations.

As described herein, a counter value is some value that is updated and read in the DDR memory 12. For example, the counter values can be associated with monitoring packet connections, such as 10Gigabit Ethernet (GE), 100GE, and higher rates. For example, the counter values can be packet counts for different services. Various types of counters are contemplated with the foregoing presented for illustration purposes. The key aspect of the counter values is they are updated frequently and a high-rates. The present disclosure attempts to use the DDR memory 12 to store these values and overcome the slow random-access limitations and the possible row hammer effects.

The counter update circuit 10 includes two First-In-First-Out (FIFO) circuits 14, 16, specifically one read request FIFO circuit 14 and one write request FIFO circuit 16. The counter update circuit 10 further includes a DDR State Machine (SM) 18 and a DDR memory controller 20. Assume there are N unique banks/bank groups in the DDR memory 12, N is a positive integer, e.g., 8. The DDR state machine 18 is configured to send N requests from the read request FIFO circuit 14, followed by N requests from the write request FIFO circuit 16. Each read request and write request goes to a different bank groups/bank address in sequence. That is, as the read and write request circuits 14, 16 fill up, the DDR state machine 18 is an access ordering state machine that bursts up to N consecutive reads and N consecutive writes to the DDR controller 20. Each write is sent to a unique bank group. If the FIFO circuits 14, 16 contain less than N requests, then the maximum number of sequential requests sent to the DDR controller 20 equals the number of requests in the FIFO circuits 14, 16. Again, N is the number of unique bank/bank groups in the DDR device.

The DDR memory 12 can be any type of DDR RAM, including DDR4 RAM, DDR5 RAM, etc. The DDR memory 12 is a separate circuit connected to the counter update circuit 10. The DDR memory 12 includes bank groups and banks. A bank is a logical group of storage that includes multiple rows and columns of storage units. A bank group is a grouping of banks. Only one bank is accessed in a single read or write operation; therefore, the number of bits in a column or a row per bank and per chip equals the memory bus width in bits (single channel). A bank's size is further determined by the number of bits in a column and a row, per chip, multiplied by the number of chips in a bank. To read from the DDR memory 12, an address is provided, and, to write to it, additionally, data is provided. This address provided is typically called a "logical address." This logical address is translated to a physical address before it is presented to the DDR memory 12. The physical address includes a bank group, bank, row, and column to determine the exact location in the DDR memory 12 to read-from or write-to. For example, the DDR memory 12 can be compliant to the JEDEC standard JESD79-4B, DDR4 SDRAM, June 2017, the contents of which are incorporated by reference.

Again, there are limitations of the DDR memory 12 for true random access. The refresh, activate and precharge, and read/write turnaround time required to read sequentially random rows in the DDR memory 12 uses up much of the available bandwidth (it is shown later that only 7% of DDR4 bandwidth is available to the user in random access applications). Also, row hammer mitigation can be built into the DDR memory 12, but the solution affects overall performance as two extra refresh cycles are inserted each time the maximum row access count is reached for any particular row; these extra refresh cycles reduce the number of cycles available to access the DDR memory 12, and this reduces the bandwidth available.

The present disclosure includes multiple locations of the same counter value in the DDR memory 12. That is, the multiple locations are each located at different locations in the DDR memory 12. This can include one location in each bank and bank group in the DDR memory 12. Again, while this approach stores counters across each bank, this is not a drawback because the number of registers in the DDR memory 12 is much larger than what is usually needed in a counter application. Thus, the actual counter value is based on a sum (combination) of all of multiple locations. Note, the terms counters and counter values used herein are data that is stored in the DDR memory 12 with each unique counter having a location in each bank and bank group.

Having each counter located in each bank and bank group enables access to the DDR memory 12 sequentially and not truly random access. This is how the present disclosure improves the random-access ability to the DDR memory 12. That is, using each bank in sequence, no time is lost during the activate and precharge, and read/write turnaround time of the read or write cycle. The activate/read/write of the next bank can occur during the read/write/precharge of the previous bank. Also, using sequential bank address accesses reduced the effect of row hammer refresh mitigation within the DDR memory 12 to improve overall performance, i.e., no need for row hammer mitigation in the DDR memory 12. Again, advantageously, this technique enables lower cost as fewer devices may be required for the same application, lower power again due to the fewer devices, more board space, and use of low-cost DDR memory 12 instead of more expensive SRAM.

This multiple location storage approach that enables read and write in a sequential manner requires no cache and, as every bank is active in the DDR memory 12, overall throughput is increased from about 7% to a minimum of about 47% and to a maximum of about 63% depending on a counter update pattern. Also, spreading the worst-case row activation across N banks in sequence, reduces the odds of a row hammer mitigation event by a factor of N, basically removing the possibility of the event occurring, leaving 100% of the available bandwidth of the device for use by the end-user.

Thus, the DDR memory 12 is organized so that each counter is spread across the banks and the bank groups. The following describe how read and write operations are performed in this memory organization scheme. The DDR controller 20 accesses banks in sequence whenever an update is made. Only one bank is updated per counter update request, namely the counter is updated at its location in the current bank in sequence. Using each bank in sequence, no time is lost during the activate and precharge, and read/write turnaround time of the read or write cycle. The activate/read/write of the next bank can occur during the read/write/precharge of the previous bank. Using sequential bank address accesses to reduce the effect of row hammer refresh mitigation within the DDR memory 12 to improve overall performance. When a counter is read by the DDR controller 20, all N bank counters are read, and then combined (SUM) to return the desired result to the host (end-user).

For example, assume the DDR memory 12 is a DDR4 device with two banks and four bank group addresses within each bank. Accesses will occur in the following order—note, the rows READ in the $1^{st}$ eight operations may or may not be the same as the second eight operations.

| Operation | Row | Bank Group | Bank Group Address |
|---|---|---|---|
| Read | A | 0 | 0 |
| Read | B | 0 | 1 |
| Read | C | 0 | 2 |
| Read | D | 0 | 3 |
| Read | E | 1 | 0 |
| Read | F | 1 | 1 |
| Read | G | 1 | 2 |
| Read | H | 1 | 3 |
| Write | J | 0 | 0 |
| Write | K | 0 | 1 |
| Write | M | 0 | 2 |
| Write | N | 0 | 3 |
| Write | P | 1 | 0 |
| Write | Q | 1 | 1 |
| Write | R | 1 | 2 |
| Write | T | 1 | 3 |

The present disclosure provides improved throughput due to the sequential access (not random) and due to the reduction in the row hammer effect. Again, the row hammer effect is the effect of multiple accesses to a row in the DDR memory 12, corrupting an adjacent row. DDR4 devices have logic to detect this and add extra refresh cycles to rows adjacent to the row causing the row hammer effect. These extra refresh cycles affect performance, and cannot be simulated, as they are not included in the simulation models. By spreading counters across N rows, the likelihood of a row hammer effect event is reduced by a factor of N. This improves performance as the number of row hammer mitigation refresh cycles is also reduced by a factor of N.

Figure 2:
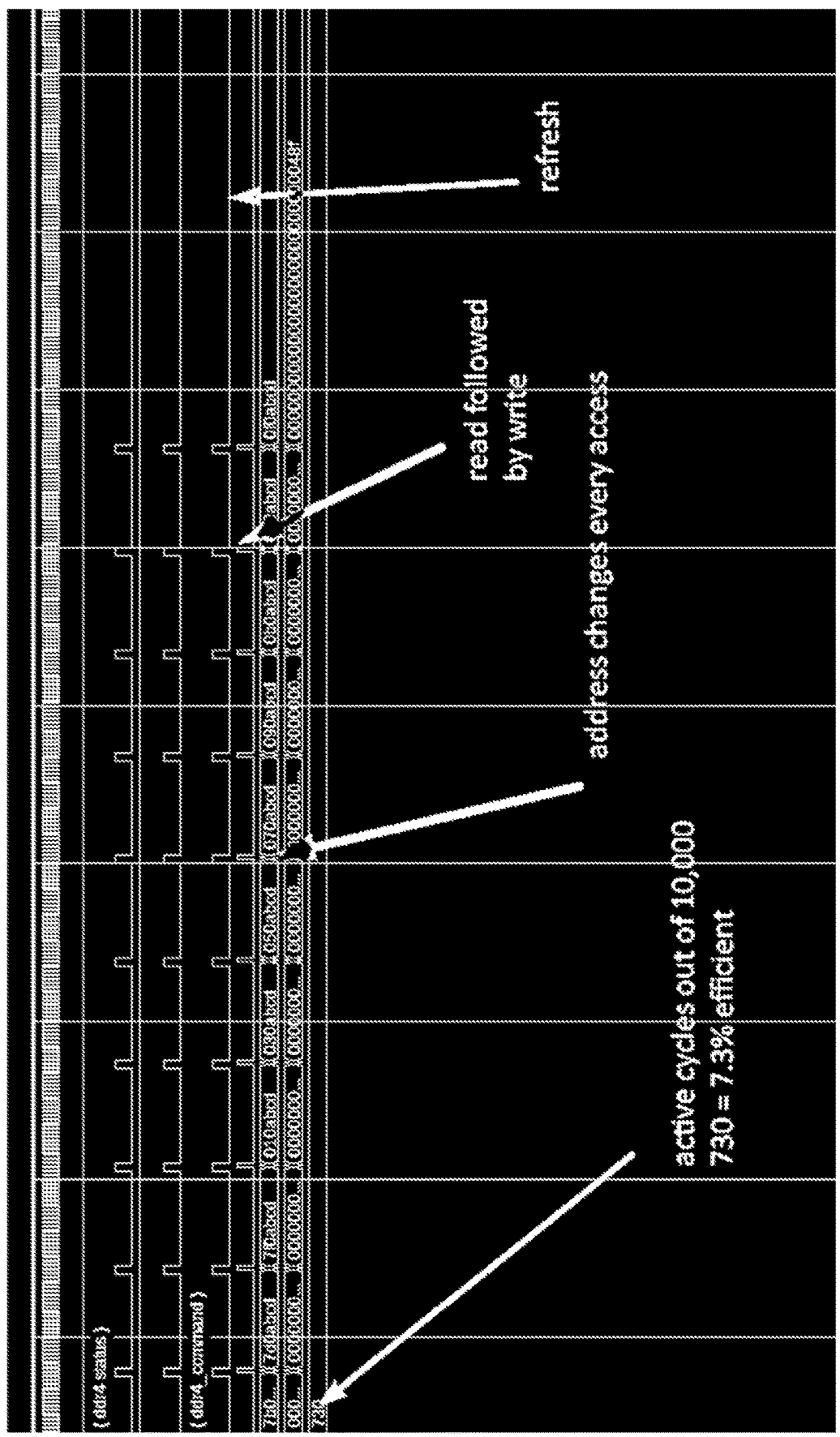
FIGS. 2-4 are screenshots of timing diagrams illustrating the overall transfer rate given different configurations with the DDR memory and the counter update circuit.
Figure 3:
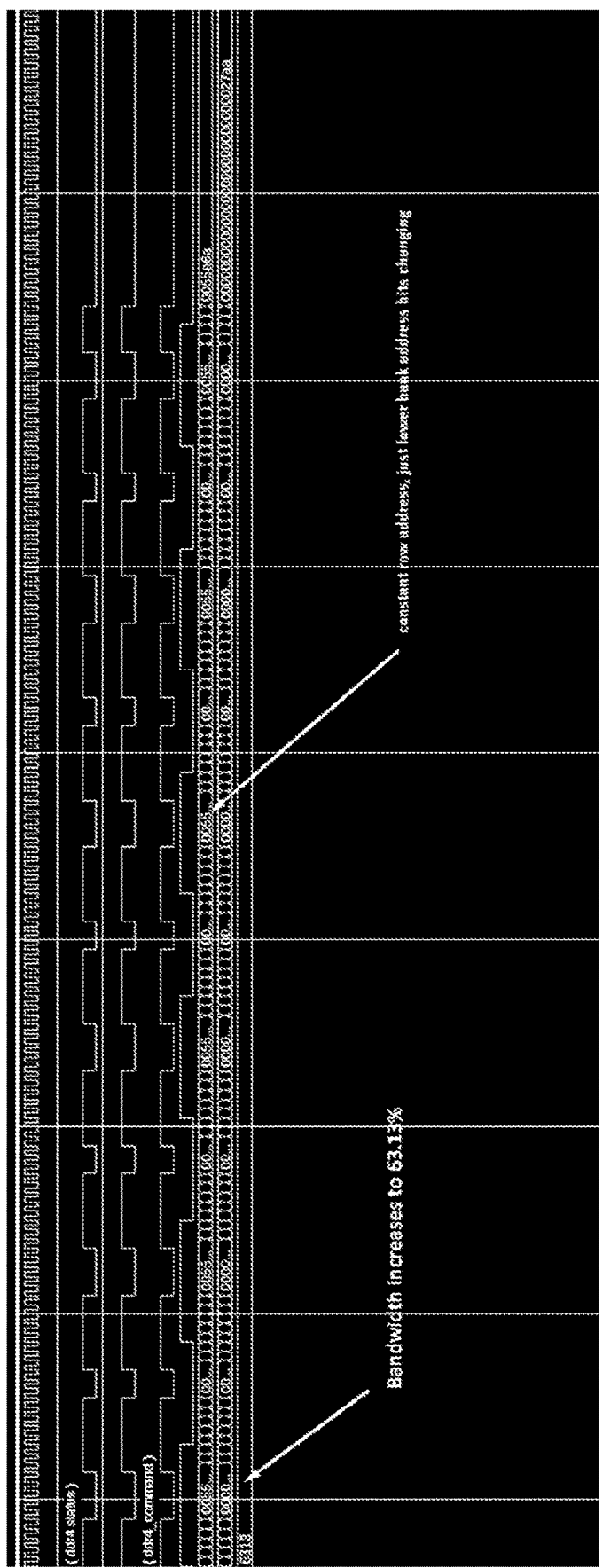
Figure 4:
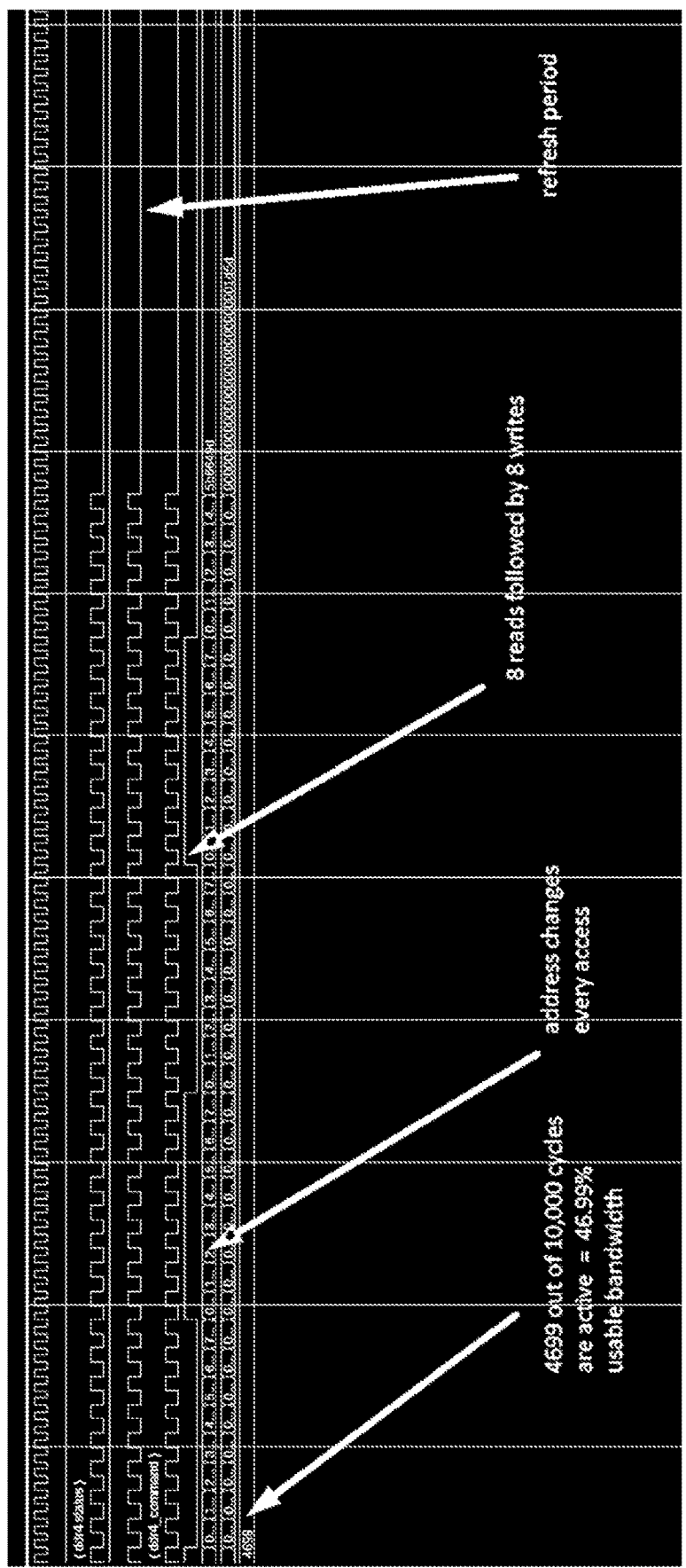

FIGS. 2-4 are screenshots of timing diagrams illustrating the overall transfer rate given different configurations with the DDR memory 12 and the counter update circuit 10. FIG. 2 is a screenshot of a conventional implementation with random access. FIG. 3 is a screenshot of an implementation using the techniques described herein where every update goes to the same row. FIG. 4 is a screenshot of an implementation using the techniques described herein where every update is random. These diagrams illustrate throughput (bandwidth) between the DDR memory 12 and the counter update circuit 10, In FIG. 2, without the techniques described herein, normal throughput to single row, in simulation is only about 7.3% of the total potential throughput to the DDR memory 12. Note, this is not the worst case, as the row hammer mitigation circuit within the DDR memory 12 will further slowdown accesses as extra refresh cycles are inserted between accesses. In this simulation, throughput is only 7.3%, and this was verified on real hardware with some efficiencies of up to 9%.

Again, the present disclosure uses multiple counter locations so that access to the DDR memory 12 is sequential. In the pathological case where every update goes to the same row (FIG. 3), performance increases 9× (9 times) to 63% efficiency from 7.3% efficiency. That does not include the extra performance increase from the decrease in row hammer extra refresh cycles that are not required. Note, it is difficult to simulate this impact but it does provide additional improvements.

In FIG. 4, performance using the present disclosure with fully random counter addresses on each transaction, throughput is increased almost 7× to 47% from 7.3%. This simulation was run with the same update request sequence as the 7.3% results without using this technique.

Figure 5:
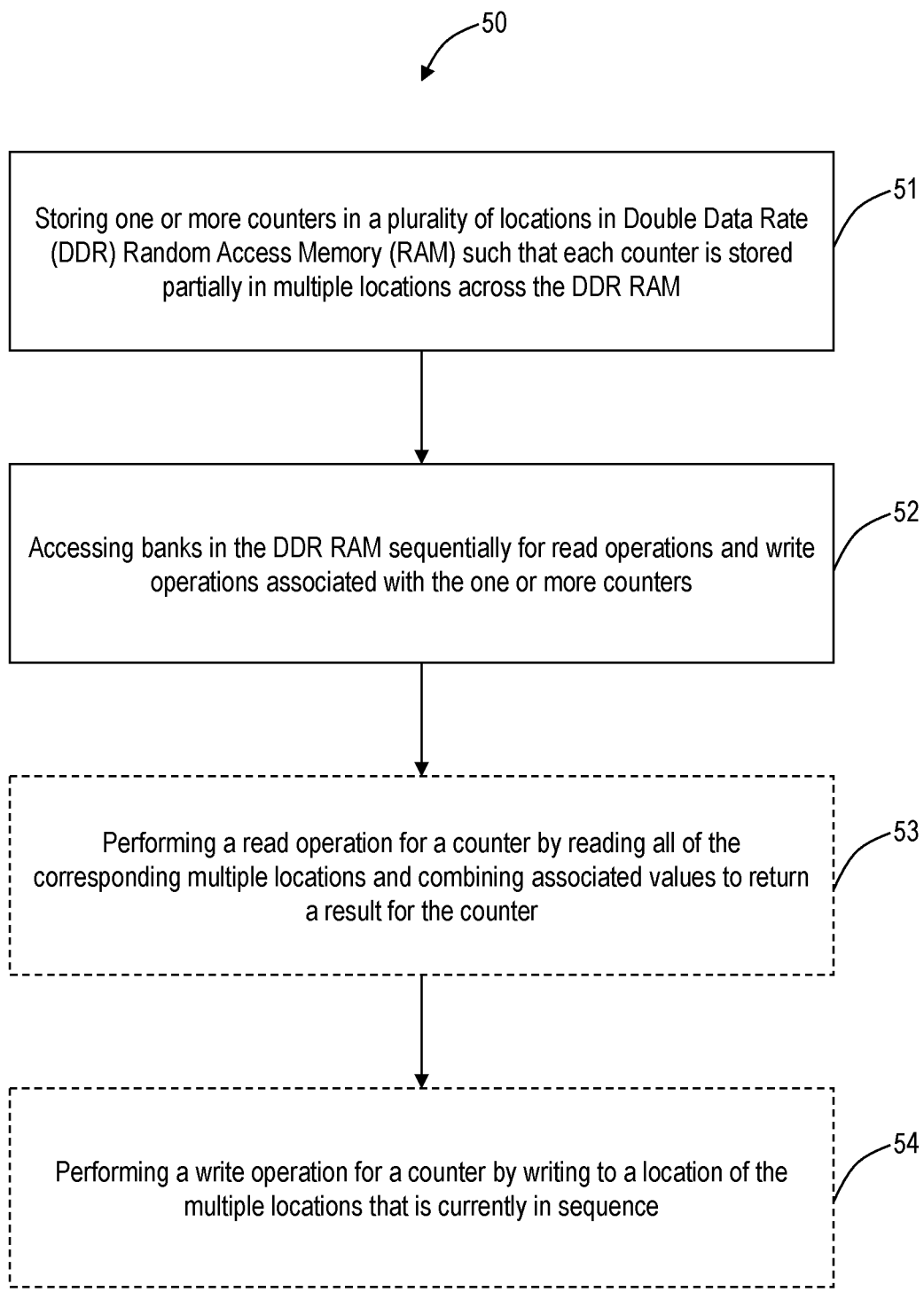
FIG. 5 is a flowchart of a process for increasing random access bandwidth of Double Data Rate (DDR) memory in a counter update application.

FIG. 5 is a flowchart of a process 50 for increasing random access bandwidth of Double Data Rate (DDR) memory in a counter update application. The process 50 contemplates operation through or by the counter update circuit 10 and/or the DDR memory 14. The process 50 includes storing one or more counters in a plurality of locations in Double Data Rate (DDR) Random Access Memory (RAM) such that each counter is stored partially in multiple locations across the DDR RAM (step 51); and accessing banks in the DDR RAM sequentially for read operations and write operations associated with the one or more counters (step 52). The multiple locations can include a location in each bank of the banks in the DDR RAM.

The process 50 can further include performing a read operation for a counter by reading all of the corresponding multiple locations and combining associated values to return a result for the counter (step 53). The process 50 can further include performing a write operation for a counter by writing to a location of the multiple locations that is currently in sequence (step 54).

The DDR RAM can include N banks and the multiple locations can include one in each of the N banks. The accessing sequentially reduces a likelihood of a row hammer effect by a factor of N. The DDR RAM can be DDR4 RAM.

In another embodiment, a counter update circuit includes a plurality of First-In-First-Out (FIFO) circuits connected to a Double Data Rate (DDR) controller connected to DDR Random Access Memory (RAM), wherein the DDR controller is configured to cause storage of one or more counters in a plurality of locations in the DDR RAM such that each counter is stored partially in multiple locations across the DDR RAM, and cause access of banks in the DDR RAM sequentially for read operations and write operations associated with the one or more counters.

In a further embodiment, a Double Data Rate (DDR) Random Access Memory (RAM) includes an interface to a DDR controller; and a plurality of banks for storing data, wherein the plurality of banks include one or more counters each stored in a plurality of locations such that each counter is stored partially in multiple locations across the plurality of banks, and wherein access to the plurality of banks by the DDR controller is performed sequentially for read operations and write operations associated with the one or more counters.

It will be appreciated that some embodiments described herein may include or utilize one or more generic or specialized processors ("one or more processors") such as microprocessors; Central Processing Units (CPUs); Digital Signal Processors (DSPs): customized processors such as Network Processors (NPs) or Network Processing Units (NPUs), Graphics Processing Units (GPUs), or the like; Field-Programmable Gate Arrays (FPGAs); and the like along with unique stored program instructions (including both software and firmware) for control thereof to implement, in conjunction with certain non-processor circuits, some, most, or all of the functions of the methods and/or systems described herein. Alternatively, some or all functions may be implemented by a state machine that has no stored program instructions, or in one or more Application-Specific Integrated Circuits (ASICs), in which each function or some combinations of certain of the functions are implemented as custom logic or circuitry. Of course, a combination of the aforementioned approaches may be used. For some of the embodiments described herein, a corresponding device in hardware and optionally with software, firmware, and a combination thereof can be referred to as "circuitry configured to," "logic configured to," etc. perform a set of operations, steps, methods, processes, algorithms, functions, techniques, etc. on digital and/or analog signals as described herein for the various embodiments.

Moreover, some embodiments may include a non-transitory computer-readable medium having instructions stored thereon for programming a computer, server, appliance, device, one or more processors, circuit, etc. to perform functions as described and claimed herein. Examples of such non-transitory computer-readable medium include, but are not limited to, a hard disk, an optical storage device, a magnetic storage device, a Read-Only Memory (ROM), a Programmable ROM (PROM), an Erasable PROM (EPROM), an Electrically EPROM (EEPROM), Flash memory, and the like. When stored in the non-transitory computer-readable medium, software can include instructions executable by one or more processors (e.g., any type of programmable circuitry or logic) that, in response to such execution, cause the one or more processors to perform a set of operations, steps, methods, processes, algorithms, functions, techniques, etc. as described herein for the various embodiments.

Although the present disclosure has been illustrated and described herein with reference to preferred embodiments and specific examples thereof, it will be readily apparent to those of ordinary skill in the art that other embodiments and examples may perform similar functions and/or achieve like results. All such equivalent embodiments and examples are within the spirit and scope of the present disclosure, are contemplated thereby, and are intended to be covered by the following claims.

What is claimed is:

1. A method comprising:
   storing one or more counters in a plurality of locations in Double Data Rate (DDR) Random Access Memory (RAM) such that each counter is stored partially in multiple locations across the DDR RAM where a value of a particular counter is a sum of all of the corresponding multiple locations, wherein the one or more counters are one or more values stored in the DDR RAM; and
   accessing banks in the DDR RAM sequentially, in lieu of random-access, for read operations and write operations on the one or more counters.

2. The method of claim 1, wherein the multiple locations include a location in each bank of the banks in the DDR RAM.

3. The method of claim 1, further comprising
performing a read operation for the particular counter by reading all of the corresponding multiple locations and combining associated values to return a result for the counter.

4. The method of claim 1, further comprising
performing a write operation for a counter by writing to a location of the multiple locations that is currently in sequence.

5. The method of claim 1, wherein the DDR RAM is DDR4 RAM.

6. A counter update circuit comprising:
a plurality of First-In-First-Out (FIFO) circuits connected to a Double Data Rate (DDR) controller connected to DDR Random Access Memory (RAM),
wherein the DDR controller is configured to
cause storage of one or more counters in a plurality of locations in the DDR RAM such that each counter is stored partially in multiple locations across the DDR RAM where a value of a particular counter is a sum of all of the corresponding multiple locations, wherein the one or more counters are one or more values stored in the DDR RAM, and
cause access of banks in the DDR RAM sequentially, in lieu of random-access, for read operations and write operations on the one or more counters.

7. The counter update circuit method of claim 6, wherein the multiple locations include a location in each bank of the banks in the DDR RAM.

8. The counter update circuit method of claim 6, wherein the DDR controller is further configured to
perform a read operation for the particular counter by causing a read of all of the corresponding multiple locations and a combination of associated values to return a result for the counter.

9. The counter update circuit method of claim 6, wherein the DDR controller is further configured to
perform a write operation for a counter by causing a write to a location of the multiple locations that is currently in sequence.

10. The counter update circuit method of claim 6, wherein the DDR RAM is DDR4 RAM.

11. A Double Data Rate (DDR) Random Access Memory (RAM) comprising:
an interface to a DDR controller; and
a plurality of banks for storing data,
wherein the plurality of banks include one or more counters each stored in a plurality of locations such that each counter is stored partially in multiple locations across the plurality of banks where a value of a particular counter is a sum of all of the corresponding multiple locations, wherein the one or more counters are one or more values stored in the plurality of banks, and
wherein access to the plurality of banks by the DDR controller is performed sequentially, in lieu of random-access, for read operations and write operations on the one or more counters.

12. The DDR RAM of claim 11, wherein the multiple locations include a location in each bank of the plurality of banks.

13. The DDR RAM of claim 11, wherein a read operation for the particular counter is performed by reading all of the corresponding multiple locations and combining associated values to return a result for the counter.

14. The DDR RAM of claim 11, wherein a write operation for a counter is performed by writing to a location of the multiple locations that is currently in sequence.

15. The DDR RAM of claim 11, wherein the DDR RAM is DDR4 RAM.

* * * * *